(12) United States Patent
Sohn (10) Patent No.: US 9,681,084 B2
(45) Date of Patent: Jun. 13, 2017

(54) RAMP SIGNAL GENERATOR AND CMOS IMAGE SENSOR USING THE SAME

(71) Applicant: SK hynix Inc., Gyeonggi-do (KR)

(72) Inventor: Young-Chul Sohn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/851,961

(22) Filed: Sep. 11, 2015

(65) Prior Publication Data

US 2016/0315602 A1    Oct. 27, 2016

(30) Foreign Application Priority Data

Apr. 24, 2015  (KR) .................. 10-2015-0057680

(51) Int. Cl.
*H04N 5/378* (2011.01)
*H03K 4/56* (2006.01)
*H04N 5/3745* (2011.01)

(52) U.S. Cl.
CPC ............ *H04N 5/378* (2013.01); *H03K 4/56* (2013.01); *H04N 5/3745* (2013.01)

(58) Field of Classification Search
CPC .......... H04N 5/378; H03K 4/00; H03M 1/366
See application file for complete search history.

(56) References Cited

U.S. PATENT DOCUMENTS

| | | | | |
|---|---|---|---|---|
| 4,055,812 A | * | 10/1977 | Rosenthal | ........... H03F 3/45071 |
| | | | | 330/253 |
| 7,379,011 B2 | * | 5/2008 | Ham | ...................... H03M 1/58 |
| | | | | 341/128 |
| 2007/0046513 A1 | * | 3/2007 | Ham | ...................... H03M 1/58 |
| | | | | 341/118 |
| 2015/0137872 A1 | * | 5/2015 | Sugahara | ............. H03K 17/168 |
| | | | | 327/391 |

FOREIGN PATENT DOCUMENTS

| | | |
|---|---|---|
| JP | 2003-060507 | 2/2003 |
| KR | 1020120088603 | 8/2012 |

* cited by examiner

*Primary Examiner* — Nicholas Giles
(74) *Attorney, Agent, or Firm* — IP & T Group LLP (57) ABSTRACT

Disclosed are a ramp signal generator capable of reducing the size of a feedback capacitor by using a current subtraction and a CMOS image sensor using the same. The ramp signal generator may include a current supply unit suitable for supplying a first current; a current subtraction unit suitable for subtracting the first current from a second current, or the second current from the first current; and a ramp signal generation unit suitable for generating a ramp signal according to a third current and a reference voltage. The third current is a result of the subtraction.

19 Claims, 5 Drawing Sheets

RAMP SIGNAL GENERATOR AND CMOS IMAGE SENSOR USING THE SAME

CROSS-REFERENCE TO RELATED APPLICATIONS

The present application claims priority of Korean Patent Application No. 10-2015-0057680, filed on Apr. 24, 2015, which is incorporated herein by reference in its entirety.

BACKGROUND

1. Field

Exemplary embodiments of the present invention relate to an image sensor (IS), and more particularly, to an integrator type ramp signal generator suitable for a single slope analog-to-digital converter (ADC) and a complementary metal oxide semiconductor (CMOS) IS using the same.

2. Description of the Related Art

Single slope ADCs (S-ADC) are generally used in CMOS ISs (CISs) and CIS products. As CISs continue the trend toward higher frame rates and are implemented in various ways, the specifications required for the market become stricter.

In one example, when a ramp signal generator is realized using a current steering digital-to-analog converter (DAC) in the CIS using the S-ADC, it is necessary to adjust the current to adjust the gain of the CIS.

As the gain of the CIS increases, the slope the ramp voltage decreases because the current flowing through the resistor is reduced to generate the ramp voltage.

In order to achieve high frame rate, high resolution, and high gain in the existing CISs, a lot of power and chip area is required.

According to conventional technologies for solving such problems, the CIS is realized using an integrator type ramp signal generator. However, the conventional integrator type ramp signal generator has a problem in that the size of the feedback capacitor is large and occupies a lot of chip area.

SUMMARY

Various embodiments are directed to a ramp signal generator having a reduced size feedback capacitor, which is accomplished through current subtraction, and a CMOS image sensor (CIS) using the same.

In an embodiment, a ramp signal generator may include: a current supply unit suitable for supplying a first current; a current subtraction unit suitable for subtracting the first current from a second current, or the second current from the first current; and a ramp signal generation unit suitable for generating a ramp signal according to a third current and a reference voltage. The third current is a result of the subtraction.

The current supply unit may include first and second current sources suitable for respectively generating the first and second current according to a current ratio of the first and second current sources.

The first current source may include a first group of PMOS transistors, and the second current source may include a second group of PMOS transistors.

The current ratio may correspond to a ratio of numbers of PMOS transistors or occupying areas of the first and second groups.

The current subtraction unit may mirror the first current, and subtract the mirrored first current from the second current.

The current subtraction unit may include first and second NMOS transistors having a current mirroring structure, the first NMOS transistor may mirror the first current to the second NMOS transistor, and the second NMOS transistor may subtract the mirrored first current from the second current.

The current supply unit may include first and second current sources suitable for respectively generating the first current.

The current subtraction unit may include third and fourth current sources, the third current source may mirror the first current to the fourth current source, and the fourth current source may generate a second current according to a current ratio of the third and fourth current sources, and subtract the second current from the first current.

The third current source may include a third group of NMOS transistors, and the fourth current source may include a fourth group of NMOS transistors.

The current ratio may correspond to a ratio of numbers of NMOS transistors or occupying areas of the third and fourth groups.

The ramp signal generator may further include: a reference voltage generation unit suitable for generating the reference voltage.

In another embodiment, a CMOS image sensor may include: a pixel array suitable for outputting a pixel signal corresponding to incident light; a ramp signal generator suitable for generating a ramp signal through subtraction of a first current from a second current, or the second current from the first current; and a read-out circuit unit suitable for reading out the pixel signal of the pixel array according to the ramp signal of the ramp signal generator.

The ramp signal generator may include: a current supply unit suitable for supplying the first current; a current subtraction unit suitable for subtracting the first from the second current, or the second current from the first current; a reference voltage generation unit suitable for generating a reference voltage; and a ramp signal generation unit suitable for generating the ramp signal according to a third current and the reference voltage, the third current is a result of the subtraction.

The current supply unit may include first and second current sources suitable for respectively generating the first and second current according to a current ratio of the first and second current sources.

The current ratio may correspond to a ratio of numbers of PMOS transistors or occupying areas.

The current subtraction unit may mirror the first current, and subtract the mirrored first current from the second current.

The current subtraction unit may include first and second NMOS transistors having a current mirroring structure, the first NMOS transistor may mirror the first current to the second NMOS transistor, and the second NMOS transistor may subtract the mirrored first current from the second current.

The current supply unit may include first and second current sources suitable for respectively generating the first current.

The current subtraction unit may include third and fourth current sources, the third current source may mirror the first current to the fourth current source, and the fourth current source may generate a second current according to a current ratio of the third and fourth current sources, and subtract the generated second current from the first current.

The third current source may include a third group of NMOS transistors, and the fourth current source may include a fourth group of NMOS transistors.

In accordance with an embodiment of the present invention, it is possible to reduce the size of the feedback capacitor through the current subtraction.

Furthermore, in accordance with an embodiment of the present invention, is possible to provide an integrator type ramp signal generator that uses less power and less chip area.

In accordance with an embodiment of the present invention, it is possible to provide an integrator type ramp signal generator suitable for a single slope analog-to-digital converter (S-ADC) of the CMOS image sensor (CIS).

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 1:
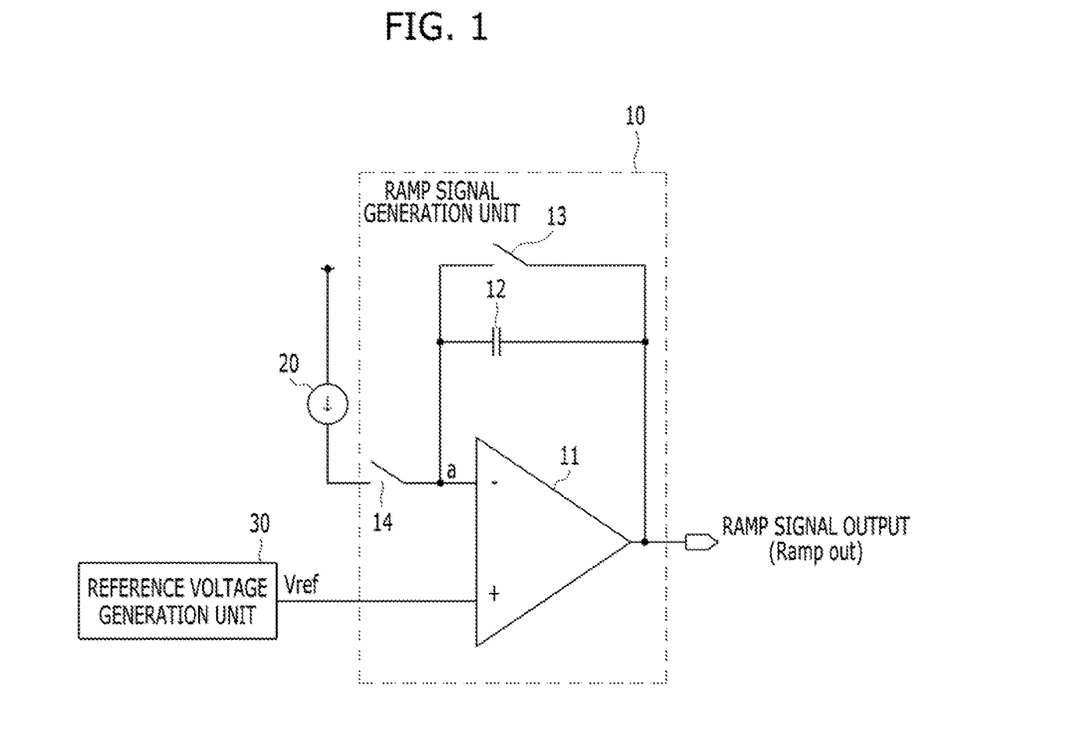
FIG. 1 is a configuration diagram of a conventional integrator type ramp signal generator according to a comparative example.

FIG. 1 is a configuration diagram of a conventional integrator type ramp signal generator according to a comparative example.

As illustrated in FIG. 1, the integrator type ramp signal generator includes a current supply unit 20 for supplying a current, a reference voltage generation unit 30 for generating a reference voltage Vref, and a ramp signal generation unit 10 for generating a ramp signal according to the reference voltage Vref.

The current supply unit 20 is a current source and supplies a predetermined current to the ramp signal generation unit 10.

The reference voltage generation unit 30 generates and outputs the reference voltage Vref to the ramp signal generation unit 10.

The ramp signal generation unit 10 of an integrator type structure includes a current supply control switch 14 that controls the supply of the current from the current supply unit 20, a reset switch 13 that initializes a differential amplifier 11 to the reference voltage Vref, a feedback capacitor 12 that feeds back a ramp signal from an output node to a negative input node of the differential amplifier 11. The differential amplifier 11 is initialized to the reference voltage Vref as the reset switch 13 is turned on, and outputs the ramp signal by performing a ramping operation according to a current passing through the turned-on current supply control switch 14.

The current supply control switch 14 is coupled between the current supply unit 20 and the negative input node of the differential amplifier 11, and supplies or blocks the current of the current supply unit 20 to the negative input node of the differential amplifier 11. In more detail, the current supply control switch 14 is turned off and blocks the current when the differential amplifier 11 is initialized, and is turned on and allows the current to pass through during the ramping operation after the initialization.

When the drivability of the differential amplifier 11 is sufficient to initialize the node a to the reference voltage Vref, the current supply control switch 14 may be omitted.

The reset switch 13 is coupled between the negative input node and the output node of the differential amplifier 11 for a closed loop feedback network in the ramp signal generation unit 10. Therefore, when the reset switch 13 is turned on, the negative input node and the output node of the differential amplifier 11 have substantially the same voltage level as that of the reference voltage Vref inputted to a positive input node of the differential amplifier 11 from the reference voltage generation unit 30. The reference voltage Vref serves as an operating potential point of the negative input node and the output node of the differential amplifier 11 for normal operation.

The feedback capacitor 12 is coupled between the negative input node and the output node of the differential amplifier 11, and feeds back the ramp signal from the output node to the negative input node of the differential amplifier 11.

The differential amplifier 11 is initialized to the voltage level of the reference voltage Vref inputted to the positive input node from the reference voltage generation unit 30 when the reset switch 13 is turned on. When the reset switch 13 is turned off, the differential amplifier 11 outputs the ramp signal according to the current inputted to the negative input node by passing through the turned-on current supply control switch 14.

Figure 2:
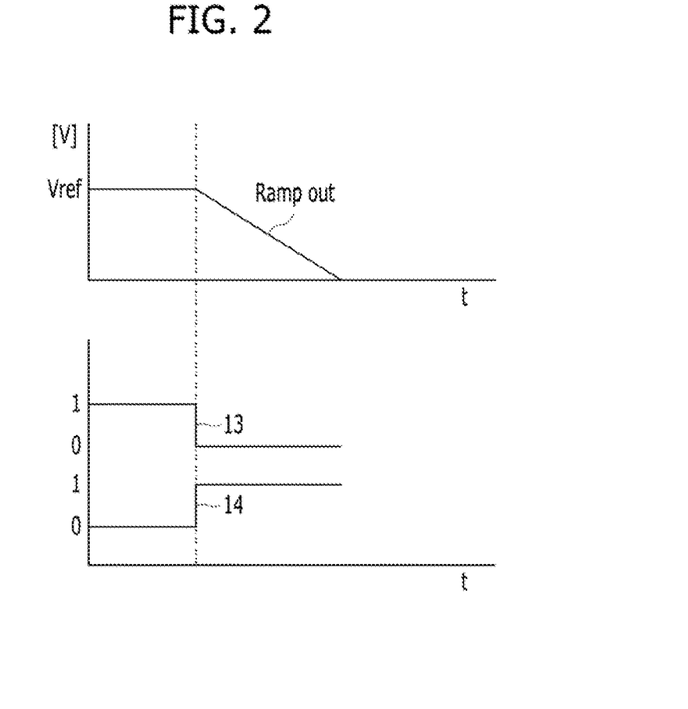
FIG. 2 is an operation timing diagram of a conventional integrator type ramp signal generator shown in FIG. 1.

FIG. 2 is an operation timing diagram of the conventional integrator type ramp signal generator shown in FIG. 1.

As illustrated in FIG. 2, during the initialization with the current supply control switch 14 turned off and the reset switch 13 turned on, the negative input node and the output node of the differential amplifier 11 have the voltage level of the reference voltage Vref by the reference voltage generation unit 30.

When the reset switch 13 is turned off and the current supply control switch 14 is turned on after the initialization, the ramp signal starts ramping.

The characteristics of the ramp signal depends on the total operation time, and the amount of current from the current supply unit 20 and a capacitance value of the feedback capacitor 12 can be determined according to the operation time and the ramping range. For example, when the ramping range is Vref and the ramping operation to 0 V should be completed before a time t1, the amount "i" of current from the current supply unit 20 and the capacitance value "C" of the feedback capacitor 12 is determined by the following Equation 1.

$$i = C*Vref/t1, \quad C = i*t1/Vref \qquad \text{[Equation 1]}$$

For example, the capacitance value of the feedback capacitor 12 should be 300 pF when the ramping operation to 0 V is performed when the ramping range is 100 mV, the operation time is 3 μS, the amount of the current from the current supply unit 20 is 10 μA.

However, it is very difficult to realize the feedback capacitor 12 of 300 pF in the chip of a CIS due to the size thereof. Depending on the situation, the realization of the feedback capacitance 12 of 300 pF in a CIS may fail.

Furthermore, in order to reduce the capacitance of the feedback capacitor 12, the amount of the current from the current supply unit 20 should be 1 μA or less. However, when the current amount is 1 μA from the current supply unit 20 in a conventional CMOS circuit, a MOS transistor in the CMOS circuit operates in a sub-threshold area or enters a linear area and thus it is not possible to guarantee accuracy of the current.

In this regard, in an embodiment of the present invention, a ramp signal generator may have a feedback capacitor with reduced size through current subtraction, which will be described with reference to FIGS. 3 to 6.

Figure 3:
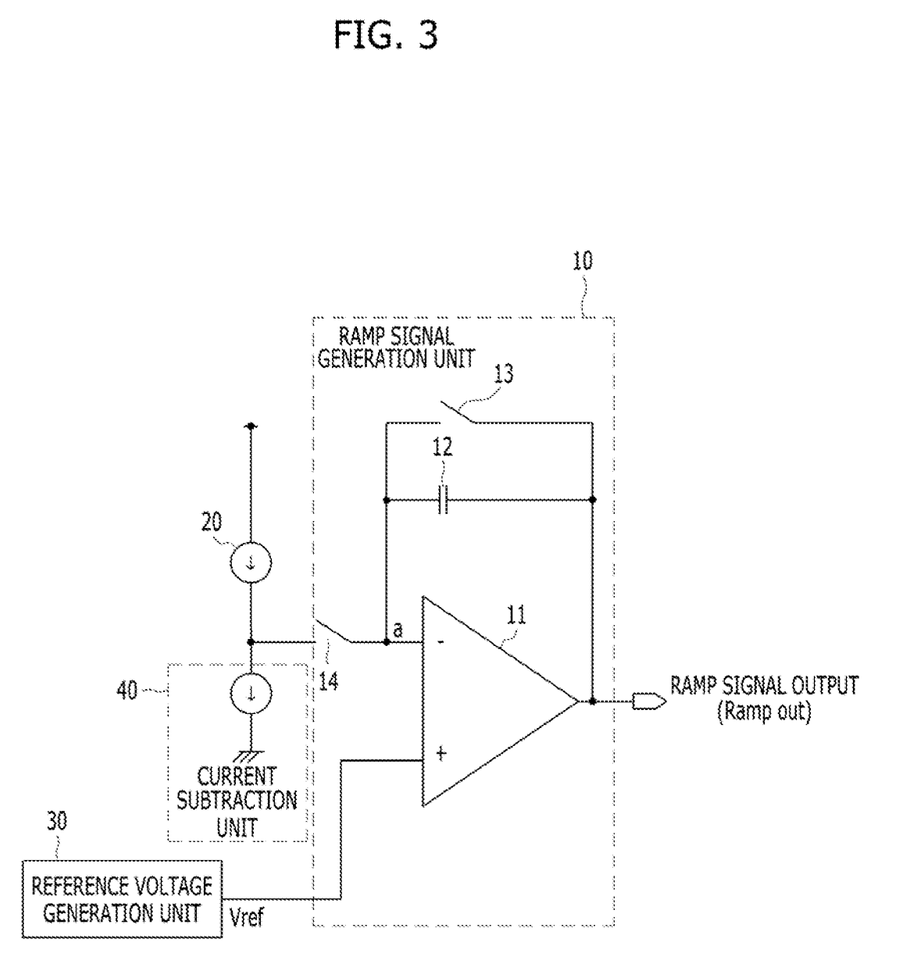
FIG. 3 is a configuration diagram of a ramp signal generator in accordance with an embodiment of the present invention.

FIG. 3 is a configuration diagram of a ramp signal generator in accordance with an embodiment of the present invention.

As illustrated in FIG. 3, the ramp signal generator in accordance with an embodiment of the present invention may include a current supply unit 20 for supplying a current, a current subtraction unit 40 for subtracting the current of the current supply unit 20, a reference voltage generation unit 30 for generating a reference voltage Vref, and a ramp signal generation unit 10 for generating a ramp signal according to the remaining current of the current subtraction unit 40 and the reference voltage Vref.

The integrator type ramp signal generator described with reference to FIGS. 1 and 2 may be the same as the ramp signal generator shown in FIG. 3 except for the current subtraction unit 40.

A first node of the current subtraction unit 40 may be coupled at a node between the current supply unit 20 and the current supply control switch 14. A second node of the current subtraction unit 40 may be grounded. The current subtraction unit 40 may subtract the current of the current supply unit 20 by a predetermined amount. The remaining current may be provided to the ramp signal generation unit 10. The remaining current or a third current $I_3$ may be the difference between first and second currents $I_1$ and $I_2$ generated by the current supply unit 20 or the current subtraction unit 40, which will be described later with reference to FIGS. 4 and 5. The third current $I_3$ may be calculated on the basis of a ratio between current sources of the current supply unit 20 and the current subtraction unit 40, which will also be described later with reference to FIGS. 4 and 5.

For example, when the ramping range is between 0 V and 100 mV, the operation time is 3 μS, the current supply unit 20 supplies 10.1 μA and the current subtraction unit 40 subtracts 10 μA from the 10.1 μA current of the current supply unit 20, 0.1 μA may be supplied to the feedback capacitor 12. Accordingly, equation 1 shows the feedback capacitor 12 having the capacitance of 3 pF. In accordance with an exemplary embodiment of the present invention, the ramp signal generator may include the feedback capacitor 12 with reduced size by the current subtraction of the current subtraction unit 40.

As described above, in an embodiment of the present invention, it is possible to adjust the capacitance value of the feedback capacitor 12 through the ratio of the two current sources of the current supply unit 20 and the current subtraction unit 40.

Figure 4:
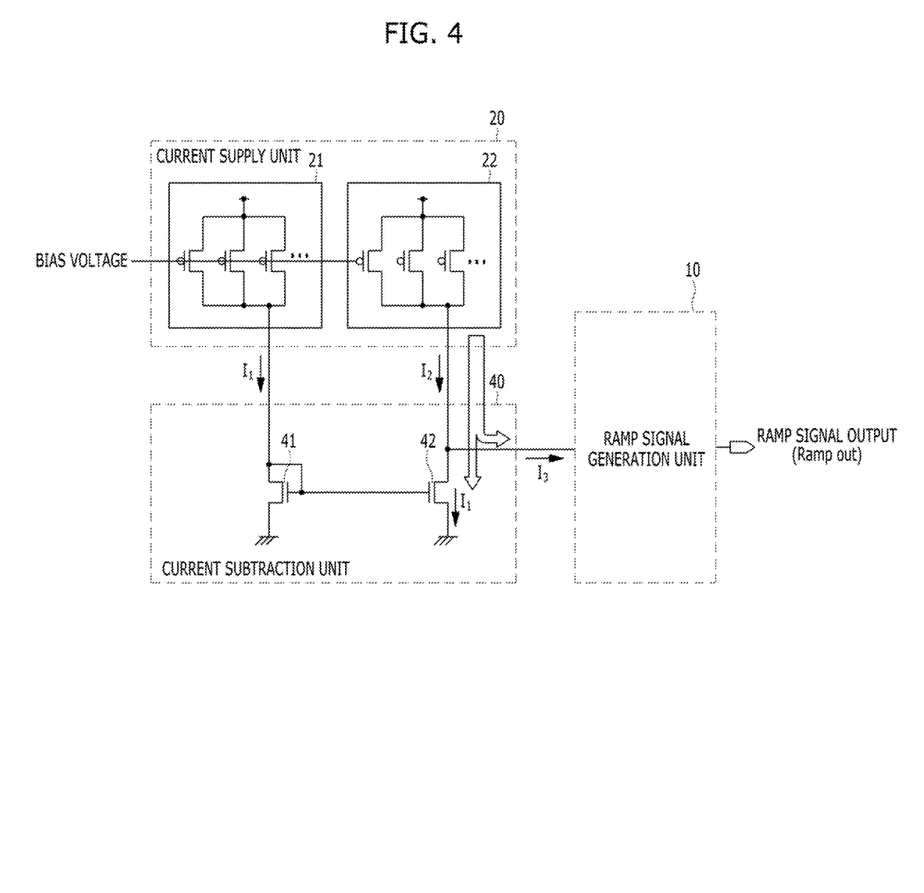
FIG. 4 is a configuration diagram of a current supply unit and a current subtraction unit shown in FIG. 3.

FIG. 4 is a configuration diagram of the current supply unit 20 and the current subtraction unit 40 shown in FIG. 3.

As illustrated in FIG. 4, the current supply unit 20 may include first and second current sources 21 and 22 for supplying the first current $I_1$ and the second current $I_2$ according to a bias voltage from an external bias supply device (not illustrated). The first and second current sources 21 and 22 may be realized according to the current ratio between the first current $I_1$ and the second current $I_2$ which are represented by a current ratio of PMOS transistors included in the first and second current sources 21 and 22. The current ratio between the first current $I_1$ and the second current $I_2$ may be realized by adjusting a ratio of the number or occupying area of the PMOS transistors in the first and second current sources 21 and 22. For example, when the ratio of the number of the PMOS transistors provided in the first and second current sources 21 and 22 is 10:11, the current ratio between the first current $I_1$ and the second current $I_2$ may be 10:11.

As illustrated in FIG. 4, the current subtraction unit 40 may mirror the first current $I_1$ of the first current source 21 of the current supply unit 20, and may subtract the mirrored first current $I_1$ from the second current $I_2$ of the second current source 22 of the current supply unit 20. The remaining current or the third current $I_3$ ($=I_2-I_1$) may be provided to the negative input node of the ramp signal generation unit 10. The current subtraction unit 40 may include first and second NMOS transistors 41 and 42, may mirror the first current $I_1$ of the first current source 21 of the current supply unit 20 to the second NMOS transistor 42 through the first NMOS transistor 41, may subtract the mirrored first current $I_1$ from the second current $I_2$ of the second current source 22 of the second current source 22. The remaining third current $I_3$ may be inputted to the ramp signal generation unit 10.

The first and second current sources 21 and 22 and the first and second NMOS transistors 41 and 42 may be realized with a cascade structure, through a single amplifier and the like.

Figure 5:
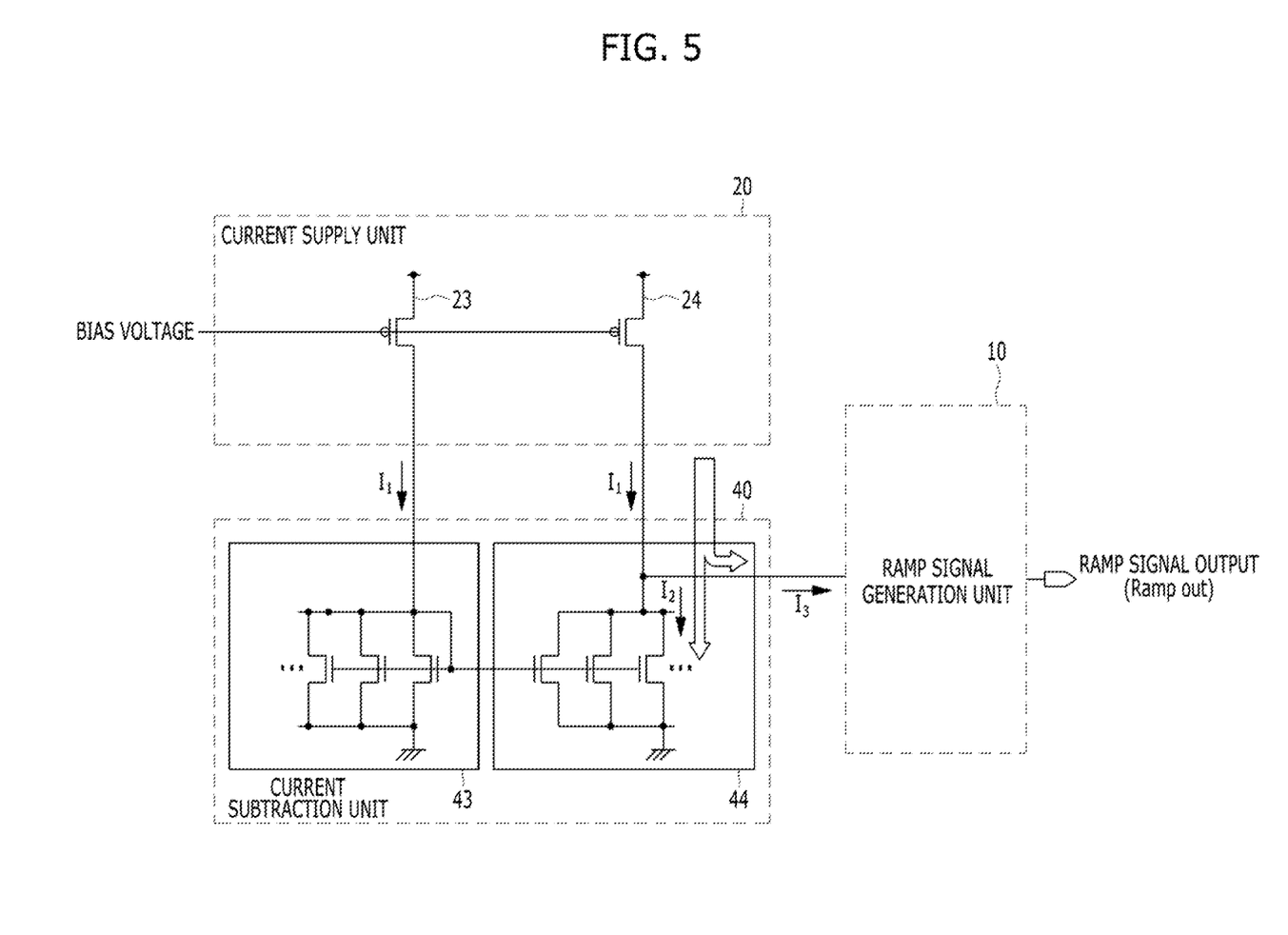
FIG. 5 is a configuration diagram of a current supply unit and a current subtraction unit shown in FIG. 3.

FIG. 5 is a configuration diagram of the current supply unit 20 and the current subtraction unit 40 shown in FIG. 3. FIG. 4 shows that the current ratio may be adjusted in the current supply unit 20 while FIG. 5 shows that the current ratio may be adjusted in the current subtraction unit 40.

As illustrated in FIG. 5, the current supply unit 20 may include first and second current sources 23 and 24 for supplying substantially the same first current $I_1$ according to a bias voltage from an external bias supply device (not illustrated). The first and second current sources 23 and 24 may be realized with first and second PMOS transistors 23 and 24, and substantially the same first current $I_1$ may be mirrored by the first and second PMOS transistors 23 and 24.

As illustrated in FIG. 5, the current subtraction unit 40 may mirror the first current $I_1$ of the first current source 23 of the current supply unit 20 to generate the second current $I_2$, and may subtract the second current $I_2$ from the first current $I_1$ of the second current source 24 of the current supply unit 20. The remaining third current $I_3$ ($=I_1-I_2$) may be provided to the ramp signal generation unit 10. The current subtraction unit 40 may include third and fourth current sources 43 and 44, and may realize the current ratio between the first current $I_1$ and the second current $I_2$, which are represented by a current ratio of NMOS transistors included in the third and fourth current sources 43 and 44. The current ratio between the first current $I_1$ and the second current $I_2$ may be realized by adjusting a ratio of the number or occupying area of the NMOS transistors in the third and fourth current sources 43 and 44. The current subtraction unit 40 may generate the second current $I_2$) by mirroring the first current $I_1$ according to the current ratio. For example, when the ratio of the number of NMOS transistors provided in the third and fourth current sources 43 and 44 is 11:10 the current ratio between the first current $I_1$ and the second current $I_2$ may be 11:10.

Figure 6:
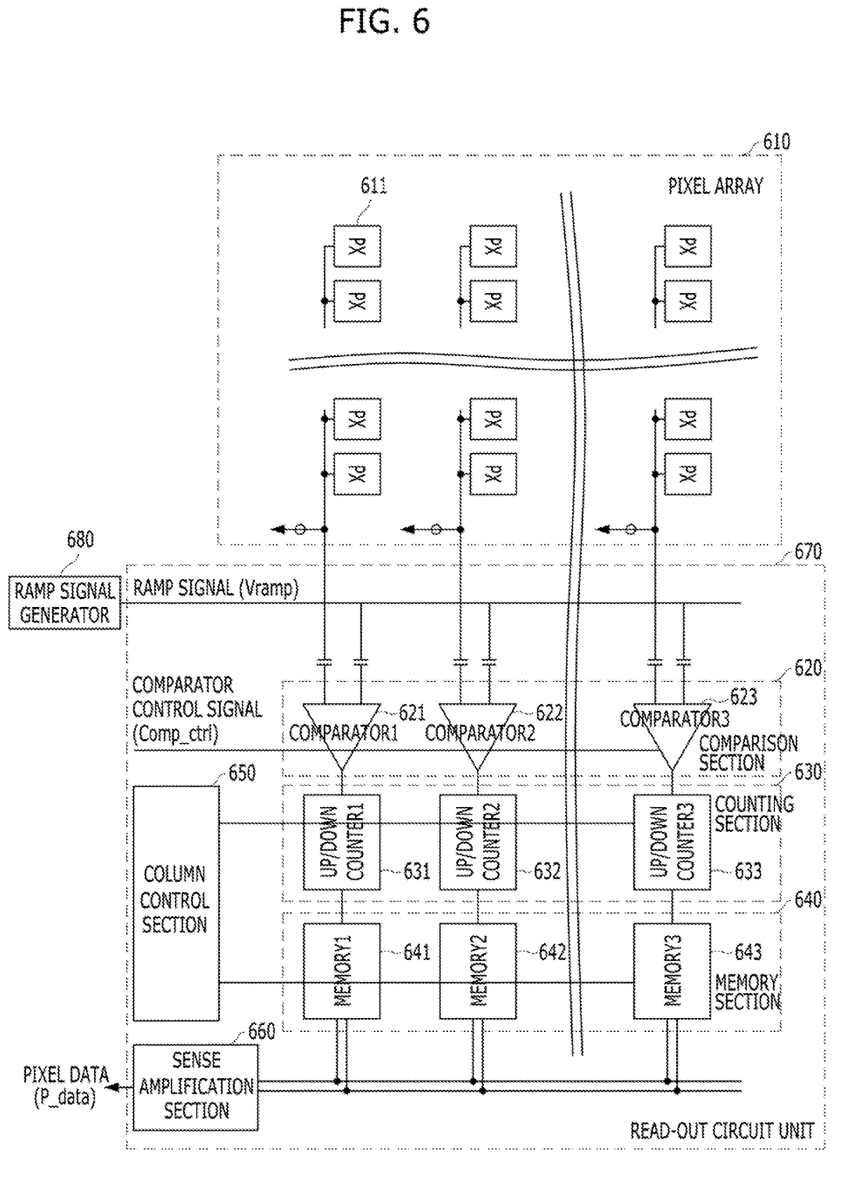
FIG. 6 is a configuration diagram of a CMOS image sensor in accordance with an embodiment of the present invention.

FIG. 6 is a configuration diagram of a CMOS image sensor in accordance with an embodiment of the present invention.

As illustrated in FIG. 6, the CIS may include a pixel array 610 that outputs a pixel signal corresponding to incident light, a ramp signal generator 680 that generates and outputs a ramp signal (a reference voltage), a comparison section 620 that compares a value of the pixel signal outputted from the pixel array 610 with a value of the ramp signal Vramp applied from the ramp signal generator 680 according to a comparator control signal Comp_ctrl received from an external control unit (not illustrated in FIG. 6), a counting section 630 that counts an output signal from the comparison section 620, a memory section 640 that stores counting information from the counting section 630, a column control section 650 that controls the operations of the counting section 630 and the memory section 640, and a sense amplification section 660 that amplifies a signal corresponding to data stored in and outputted from the memory section 640 and outputs pixel data P-data. The ramp signal generator 680 may be realized using the ramp signal generator described with reference to FIGS. 3 to 5.

The comparison section 620 may include a plurality of comparators 621 to 623, the counting section 630 may include a plurality of up/down counters 631 to 633, and the memory section 640 may include a plurality of memories 641 to 643. In another embodiment, the counting section 630 may also be realized using memories instead of the up/down counters 631 to 633.

Hereinafter, an operation (an analog-to-digital conversion operation) of one comparator 621, one up/down counter 631, and one memory 641 will be described as an example.

The comparator 621 may receive a pixel signal 1, which is outputted from a first column pixel 611 of the pixel array 610, through one side terminal thereof, may receive the ramp signal Vramp, which is applied from the ramp signal generator 680 through the other side terminal thereof, and may compare values of the two signals according to the comparator control signal Comp_ctrl received from the external control unit.

Since a voltage level of the ramp signal Vramp is reduced as time passes, the values of the two signals inputted to the comparator 621 will even eventually coincide. When this time passes, the value outputted from the comparator 621 may be inversed.

Accordingly the up/down counter 631 counts from when the ramp signal Vramp falls until the output of the comparator 621 is inversed.

The memory 641 may store and output a value (counting information) counted by the up/down counter 631.

As described above, in accordance with the present invention, in order to avoid using more chip area due to the size of the capacitor in the existing integrator type ramp signal generators, it is possible to reduce the size of the capacitor by using current subtraction.

Although various embodiments have been described for illustrative purposes, it will be apparent to those skilled in the art that various changes and modifications may be made without departing from the spirit and scope of the invention as defined in the following claims.

What is claimed is:

1. A ramp signal generator comprising:
   a current supply unit including first and second current sources that supply a first current and a second current, respectively, according to a bias voltage;
   a current subtraction unit suitable for subtracting the first current from the second current, or the second current from the first current; and
   a ramp signal generation unit suitable for generating a ramp signal according to a third current and a reference voltage,
   wherein the current subtraction unit generates the third current corresponding to a difference between the first current and the second current supplied according to a current ratio of the first and second current sources, and applies the third current to the ramp signal generation unit.

2. The ramp signal generator of claim 1,
   wherein the first current source includes a first group of PMOS transistors, and
   wherein the second current source includes a second group of PMOS transistors.

3. The ramp signal generator of claim 2, wherein the current ratio corresponds to a ratio of numbers of PMOS transistors or occupying areas of the first and second groups.

4. The ramp signal generator of claim 1, wherein the current subtraction unit mirrors the first current, and subtracts the mirrored first current from the second current.

5. The ramp signal generator of claim 4,
   wherein the current subtraction unit comprises first and second NMOS transistors having a current mirroring structure,
   wherein the first NMOS transistor mirrors the first current to the second NMOS transistor, and
   wherein the second NMOS transistor subtracts the mirrored first current from the second current.

6. The ramp signal generator of claim 1, further comprising:
   a reference voltage generation unit suitable for generating the reference voltage.

7. A CMOS image sensor comprising:
   a pixel array suitable for outputting a pixel signal corresponding to incident light;
   a ramp signal generator suitable for generating a ramp signal through subtraction of a first current from a second current, or the second current from the first current; and
   a read-out circuit unit suitable for reading out the pixel signal of the pixel array according to the ramp signal of the ramp signal generator
   wherein the ramp signal generator comprises:
      a current supply unit including first and second current sources each supplying the first current and the second current according to a bias voltage;
      a current subtraction unit suitable for subtracting the first current from the second current, or the second current from the first current;

a reference voltage generation unit suitable for generating a reference voltage; and a ramp signal generation unit suitable for generating the ramp signal according to a third current and the reference voltage, wherein the current subtraction unit generates the third current corresponding to a difference between the first current and the second current supplied according to a current ratio of the first and second current sources, and applies the third current to the ramp signal generation unit.

8. The CMOS image sensor of claim 7, wherein the current ratio corresponds to a ratio of numbers of PMOS transistors or occupying areas.

9. The CMOS image sensor of claim 7, wherein the current subtraction unit mirrors the first current, and subtracts the mirrored first current from the second current.

10. The CMOS image sensor of claim 9,
wherein the current subtraction unit comprises first and second NMOS transistors having a current mirroring structure,
wherein the first NMOS transistor mirrors the first current to the second NMOS transistor, and
wherein the second NMOS transistor subtracts the mirrored first current from the second current.

11. A ramp signal generator comprising:
a current supply unit including first and second current sources each supplying a first current according to a bias voltage;
a current subtraction unit suitable for mirroring the first current to generate a second current, and subtracting the first current from the second current, or the second current from the first current; and
a ramp signal generation unit suitable for generating a ramp signal according to a third current and a reference voltage,
wherein the current subtraction unit generates the third current corresponding to difference between the first current and the second current supplied according to a current ratio of the first and second current sources, and applies the third current to the ramp signal generation unit.

12. The ramp signal generator of claim 11,
wherein the first current source includes a first group of PMOS transistors, and wherein the second current source includes a second group of PMOS transistors.

13. The ramp signal generator of claim 11,
wherein the current subtraction unit includes third and fourth current sources,
wherein the third current source mirrors the first current to the fourth current source, and
wherein the fourth current source generates the second current according to a current ratio of the third and fourth current sources, and subtracts the generated second current from the first current.

14. The ramp signal generator of claim 13,
wherein the third current source includes a third group of NMOS transistors, and
wherein the fourth current source includes a fourth group of NMOS transistors.

15. The ramp signal generator of claim 14, wherein the current ratio of the third and fourth current sources corresponds to a ratio of numbers of NMOS transistors or occupying areas of the third and fourth groups.

16. The CMOS image sensor of claim 7,
wherein the first current source includes a first group of PMOS transistors, and
wherein the second current source includes a second group of PMOS transistors.

17. The CMOS image sensor of claim 7,
wherein the current subtraction unit comprises third and fourth current sources,
wherein the third current source mirrors the first current to the fourth current source, and
wherein the fourth current source generates the second current according to a current ratio of the third and fourth current sources, and subtracts the generated second current from the first current.

18. The CMOS image sensor of claim 17,
wherein the third current source comprises a third group of NMOS transistors, and
wherein the fourth current source comprises a fourth group of NMOS transistors.

19. The ramp signal generator of claim 1,
wherein the first and second current sources supply the first and second currents according to only the bias voltage.

* * * * *